United States Patent
Xu et al.

(10) Patent No.: US 12,266,470 B2
(45) Date of Patent: Apr. 1, 2025

(54) MEMS SOLENOID TRANSFORMER AND MANUFACTURING METHOD THEREOF

(71) Applicant: BEIHANG UNIVERSITY, Haidian District (CN)

(72) Inventors: Tiantong Xu, Haidian District (CN); Zhi Tao, Haidian District Beijing (CN); Haiwang Li, Haidian District (CN); Hanxiao Wu, Haidian District (CN); Yanxin Zhai, Haidian District (CN); Kaiyun Zhu, Haidian District (CN); Wenbin Wang, Haidian District (CN); Xiaoda Cao, Haidian District (CN); Weidong Fang, Haidian District (CN)

(73) Assignee: BEIHANG UNIVERSITY, Beijing (CN)

( * ) Notice: Subject to any disclaimer, the term of this patent is extended or adjusted under 35 U.S.C. 154(b) by 974 days.

(21) Appl. No.: 17/290,655

(22) PCT Filed: Jul. 8, 2019

(86) PCT No.: PCT/CN2019/095066
§ 371 (c)(1),
(2) Date: Apr. 30, 2021

(87) PCT Pub. No.: WO2020/087973
PCT Pub. Date: May 7, 2020

(65) Prior Publication Data
US 2021/0358688 A1   Nov. 18, 2021
US 2024/0428990 A2   Dec. 26, 2024

(30) Foreign Application Priority Data
Oct. 30, 2018 (CN) .......................... 201811278308.7
Oct. 30, 2018 (CN) .......................... 201811278321.2

(51) Int. Cl.
*H01F 17/06* (2006.01)
*H01F 1/16* (2006.01)
(Continued)

(52) U.S. Cl.
CPC .......... *H01F 41/0233* (2013.01); *H01F 1/16* (2013.01); *H01F 3/02* (2013.01); *H01F 17/062* (2013.01);
(Continued)

(58) Field of Classification Search
CPC ........ H01F 17/06; H01F 17/062; H01F 30/16; H01F 27/2895; H01F 1/16; H01F 3/02;
(Continued)

(56) References Cited

U.S. PATENT DOCUMENTS 3,486,149 A * 12/1969 Klein ...................... H01F 19/08
336/200
4,777,465 A   10/1988 Meinel
(Continued)

FOREIGN PATENT DOCUMENTS

CN   101553890 A   10/2009
CN   101553890 A1  10/2009
(Continued)

OTHER PUBLICATIONS

Xing Xing et al.; "High-Bandwidth Low-Insertion Loss Solenoid Transformers Using FeCoB Multilayers"; IEEE Transactions on Power Electronics, vol. 28, No. 9, Sep. 2013.
(Continued)

*Primary Examiner* — Tszfung J Chan
(74) *Attorney, Agent, or Firm* — Dickinson Wright PLLC (57) ABSTRACT

Embodiments of the present application provide a MEMS solenoid transformer, comprising a silicon substrate, a soft magnetic core, a first solenoid and a second solenoid; wherein, the soft magnetic core is wrapped inside the silicon
(Continued)

substrate, the silicon substrate is provided with a first spiral channel and a second spiral channel, and two opposite sides of the soft magnetic core respectively pass through a center of the first spiral channel and a center of the second spiral channel; the first solenoid and the second solenoid are respectively disposed in the first spiral channel and the second spiral channel. By disposing the soft magnetic core, the first solenoid and the second solenoid of the transformer inside the silicon substrate completely, the thickness of the silicon substrate is fully utilized, and the obtained transformer has a larger winding cross-sectional area and a higher magnetic flux, increasing the inductance value of the transformer.

9 Claims, 6 Drawing Sheets

(51) Int. Cl.
H01F 3/02 (2006.01)
H01F 27/245 (2006.01)
H01F 27/26 (2006.01)
H01F 41/02 (2006.01)
H01F 41/04 (2006.01)
H01L 49/02 (2006.01)

(52) U.S. Cl.
CPC ......... *H01F 27/245* (2013.01); *H01F 27/263* (2013.01); *H01F 41/042* (2013.01); *H01L 28/10* (2013.01)

(58) Field of Classification Search
CPC .. H01F 27/245; H01F 27/263; H01F 41/0233; H01F 41/042; H01L 28/10
USPC ........................................ 336/200, 232, 229
See application file for complete search history.

(56) References Cited

U.S. PATENT DOCUMENTS

| | | |
|---|---|---|
| 6,694,603 B1 | 2/2004 | Zhang et al. |
| 2003/0005569 A1 | 1/2003 | Hiatt et al. |
| 2003/0011458 A1* | 1/2003 | Nuytkens ................ H01F 27/36 336/200 |
| 2003/0070282 A1* | 4/2003 | Hiatt ....................... H01F 41/34 336/213 |
| 2005/0156698 A1 | 7/2005 | Pleskach et al. |
| 2009/0273428 A1 | 11/2009 | Chen |
| 2015/0101854 A1* | 4/2015 | Lee ....................... H01F 41/046 29/606 |
| 2015/0116950 A1 | 4/2015 | Yoo et al. |
| 2017/0084384 A1* | 3/2017 | Otsubo ................... H01F 17/06 |

FOREIGN PATENT DOCUMENTS

| | | | | |
|---|---|---|---|---|
| CN | 101593605 A | | 12/2009 | |
| CN | 202363203 U | | 8/2012 | |
| CN | 106291405 A | * | 1/2017 | ......... G01R 33/0052 |
| CN | 106772143 A | | 5/2017 | |
| CN | 107367288 A | * | 11/2017 | .......... C23C 16/402 |
| CN | 109390144 A | | 2/2019 | |
| CN | 109599249 A | | 4/2019 | |
| DE | 3346659 A | | 7/1985 | |
| JP | 2011114033 A | * | 6/2011 | |
| JP | 2016051765 | | 4/2016 | |
| JP | 2016051765 A | | 4/2016 | |

OTHER PUBLICATIONS

Ming Xu, et al.; "A Microfabricated Transformer for High-Frequency Power or Signal Conversion" Center for Microelectronic Sensors and MEMS, Department of Electrical & Computer Engineering and Computer Science, University of Cincinnati, Cincinnati, OH 45221-0030 U.S.A; IEEE Transactions on Magnetics, vol. 34, No. 4, Jul. 1998.
FSR of Priority Application No. CN2018112783087.
FSR of Priority Application No. CN2018112783212.
Higher Mechanical Design Theory (relevant section).
Higher Mechanical Theory (relevant section).
ISR PCT/CN2019/095066—Jul. 8, 2019.
Written Opinion of the International Searching Authority—PCT/CN2019/095066—Jul. 8, 2019.

* cited by examiner

MEMS SOLENOID TRANSFORMER AND MANUFACTURING METHOD THEREOF

CROSS-REFERENCE TO RELATED APPLICATION

The present application is a 371 United States National Stage Application, which claims the benefit of PCT International Patent Application No. PCT/CN/2019/095066, filed Jul. 8, 2019, which claims priority to Chinese Application No. 201811278308.7 filed on Oct. 30, 2018, entitled "MEMS Toroidal Solenoid Transformer and Manufacturing Method Thereof" and Chinese Application No. 201811278321.2 filed on Oct. 30, 2018, entitled "MEMS Square Loop Solenoid Transformer and Manufacturing Method Thereof", which are hereby incorporated by reference in their entirety.

FIELD OF TECHNOLOGY

Embodiments of the present application relate to the technical field of micro-electro-mechanical system (MEMS), and in particular, to a MEMS solenoid transformer and a manufacturing method thereof.

BACKGROUND

A micro-transformer in a micro-electro-mechanical system (MEMS), consisting of a magnetic core and windings, is used to transfer electrical energy between two circuits based on the principle of electromagnetic induction. Compared with conventional transformers, the size of the magnetic core is dramatically decreased and the winding form has also changed. Micro-transformers are widely used in micro-electronic equipment and information equipment, and may play a role in voltage conversion, current conversion, impedance conversion, isolation, and voltage stabilization and so on.

At present, the micro-transformer based on MEMS technology are mainly divided into two types, i.e., planar spiral type and solenoid type. For the structure of the planar spiral micro-transformer, as the number of turns of winding increases, the diameter of coils becomes larger and the total magnetic flux along a core cannot increase linearly but the increment of the total magnetic flux gradually decreases. Therefore, the number of turns of this structure is generally limited, resulting in a bottleneck in the increase of the total power of this transformer. While the solenoid transformer overcomes the limitation of the number of turns of winding and makes full use of the vertical space inside a substrate. When the same transformer power is obtained, the occupied chip surface space is smaller, which is conducive to the further development of transformer miniaturization.

However, most of the current micro-transformers based on MEMS technology use thin-film manufacturing processes which belongs to an additive manufacturing method. Therefore, the majority of the structure of the obtained micro-transformer is located above the surface of the substrate, which makes it difficult to ensure the strength of the transformer. The transformer manufactured by the thin-film process has a small wire area through which large current cannot flow, which limits the further increase of its working power. In addition, the transformer obtained by the thin-film manufacturing process has a limited vertical height such that windings of the transformer have small cross-sectional areas, resulting in low inductance and small magnetic flux of the transformer.

SUMMARY

Embodiments of the present application provide a MEMS solenoid transformer and a manufacturing method thereof that solve the above-mentioned problems or at least partially solve the above-mentioned problems.

In a first aspect, an embodiment of the present application provides a MEMS solenoid transformer, including: a silicon substrate, a soft magnetic core, a first solenoid and a second solenoid: wherein, the soft magnetic core is wrapped inside the silicon substrate, the silicon substrate is provided with a first spiral channel and a second spiral channel, and two opposite sides of the soft magnetic core respectively pass through a center of the first spiral channel and a center of the second spiral channel: the first solenoid and the second solenoid are respectively disposed in the first spiral channel and the second spiral channel;

wherein the soft magnetic core is a toroidal soft magnetic core or a square loop soft magnetic core.

Further, the silicon substrate includes an upper silicon substrate and a lower silicon substrate, the toroidal soft magnetic core includes an upper core and a lower core, and the upper core has the same shape as the lower core; and the upper silicon substrate is provided with a core slot on a lower surface thereof corresponding to the shape of the upper core, and the lower silicon substrate is provided with a core slot on an upper surface thereof corresponding to the shape of the lower core: the upper core and the lower core are disposed in the corresponding core slots, respectively, and the lower surface of the upper silicon substrate and the upper surface of the lower silicon substrate are bonded to each other, so that a lower surface of the upper core and an upper surface of the lower core are aligned with each other.

Further, the first spiral channel and the second spiral channel include a plurality of first horizontal trenches, a plurality of second horizontal trenches, and a plurality of vertical through holes, respectively;

the first horizontal trenches are disposed on an upper surface of the silicon substrate, the second horizontal trenches are disposed on a lower surface of the silicon substrate, and the vertical through holes penetrate the upper and lower surfaces of the silicon substrate; and a head and a tail of any one of the first horizontal trenches of the first spiral channel and the second spiral channel communicate with two vertical through holes respectively, and the two vertical through holes communicate with two adjacent second horizontal trenches, respectively.

Further, the MEMS solenoid transformer also includes four pins and four pin slots; and the four pin slots are disposed on the upper surface of the silicon substrate, two of the four pin slots communicate with the head and the tail of the first spiral channel, respectively, and the other two of the four pin slots communicate with the head and the tail of the second spiral channel, respectively, and the four pins are arranged in the four pin slots, respectively.

Further, the soft magnetic core is made of iron-nickel alloy material or iron-cobalt alloy material.

Further, the first solenoid and the second solenoid are made of metallic copper.

In a second aspect, an embodiment of the present application provides a method for manufacturing a MEMS solenoid transformer, including:

step 1, fabricating an upper silicon substrate and a lower silicon substrate, respectively: wherein,
the fabricating an upper silicon substrate includes:
performing a first thermal oxidation on a first silicon wafer with a first preset thickness;
according to the structures and relative positions of the first spiral channel and the second spiral channel, performing deep silicon etching on an upper surface, inside and a lower surface of the first silicon wafer subjected to the first thermal oxidation respectively to obtain a plurality of first horizontal trenches, upper halves of a plurality of vertical through holes, and a core slot;
performing a second thermal oxidation on the first silicon wafer subjected to the deep silicon etching to obtain the upper silicon substrate;
the fabricating a lower silicon substrate includes:
performing the first thermal oxidation on a second silicon wafer with the first preset thickness;
according to the structures and relative positions of the first spiral channel and the second spiral channel, performing the deep silicon etching on an upper surface, inside and a lower surface of the second silicon wafer subjected to the first thermal oxidation respectively to obtain a core slot, lower halves of the plurality of vertical through holes, and a plurality of second horizontal trenches;
performing the second thermal oxidation on the second silicon wafer subjected to the deep silicon etching to obtain the lower silicon substrate;
step 2, electroplating inside the core slots of the upper silicon substrate and the lower silicon substrate to form an upper core and a lower core, respectively;
step 3, after disposing an upper surface of the upper silicon substrate and a lower surface of the lower silicon substrate opposite to each other and aligning a lower surface of the upper core and an upper surface of the lower core with each other, bonding the upper silicon substrate and the lower silicon substrate at low temperature to form the first spiral channel and the second spiral channel in the upper silicon substrate and the lower silicon substrate which are bonded; and
step 4, electroplating in the first spiral channel and the second spiral channel to form a first solenoid and a second solenoid, thereby obtaining the MEMS solenoid transformer.
Further, the electroplating inside the core slot of the upper silicon substrate to form an upper core specifically includes:
after registering a metal mask with a core slot pattern with the core slot on a lower surface of the upper silicon substrate, tightly attaching the metal mask to the lower surface of the upper silicon substrate; and
after magnetron sputtering metallic nickel or metallic cobalt with a second preset thickness as a seed layer on the lower surface of the upper silicon substrate, electroplating iron-nickel alloy or iron-cobalt alloy with a third preset thickness inside the core slot of the upper silicon substrate to obtain the upper core: correspondingly,
the electroplating inside the core slot of the lower silicon substrate to form a lower core specifically includes:
after registering a metal mask with a core slot pattern with the core slot on an upper surface of the lower silicon substrate, tightly attaching the metal mask to the upper surface of the lower silicon substrate; and
after magnetron sputtering metallic nickel or metallic cobalt with the second preset thickness as a seed layer on the upper surface of the lower silicon substrate, electroplating iron-nickel alloy or iron-cobalt alloy with the third preset thickness inside the core slot of the lower silicon substrate to obtain the lower core.

Further, the electroplating in the first spiral channel and the second spiral channel to form a first solenoid and a second solenoid specifically includes:
magnetron sputtering metallic titanium with a fourth preset thickness as an intermediate layer on the lower surface of the lower silicon substrate, magnetron sputtering metallic copper with a fifth preset thickness as a seed layer on the intermediate layer, and then electroplating metallic copper in the second horizontal trenches and the vertical through holes of the first spiral channel and the second spiral channel until the metallic copper is filled to the position of a lower plane of the first horizontal trenches; and
after magnetron sputtering metallic copper as a seed layer on the upper surface of the upper silicon substrate, electroplating metallic copper until the first spiral channel and the second spiral channel are completely filled with the metallic copper to obtain the first solenoid and the second solenoid.

Further, the fabricating an upper silicon substrate further includes:
according to the structures and positions of four pins, performing deep silicon etching on the upper surface of the first silicon wafer subjected to the first oxidation to obtain four pin slots: correspondingly,
step 4 further includes:
electroplating in the four pin slots to form the four pins.

For the MEMS solenoid transformer and the manufacturing method thereof according to the embodiments of the present application, by disposing the toroidal or square loop soft magnetic core, the first solenoid and the second solenoid of the transformer inside the silicon substrate completely, the thickness of the silicon substrate is fully utilized, and the obtained transformer has a larger winding cross-sectional area and a higher magnetic flux, which makes the inductance value of the transformer higher; at the same time, the silicon substrate plays a protective role on the soft magnetic core, the first solenoid and the second solenoid, the strength of the transformer is improved, and the good impact resistance is provided.

BRIEF DESCRIPTION OF THE DRAWINGS

In order to more clearly illustrate technical solutions disclosed in the embodiments of the present application or the prior art, the drawings needed to be used in the descriptions of the embodiments or the prior art will be briefly explained below. Obviously, the drawings in the following description are only certain embodiments of the present application, and other drawings can be obtained according to the drawings without any creative work for those skilled in the art.

REFERENCE NUMERALS

| | |
|---|---|
| 1-silicon substrate; | 2-toroidal soft magnetic core; |
| 2'-square loop soft magnetic core; | 3-first solenoid; |
| 4-second solenoid; | 5-pin; |
| 5'-pin slot; | 11-upper silicon substrate; |
| 12-lower silicon substrate; | 21-upper core; |
| 22-lower core; | 31'-first horizontal trench; |
| 32'-second horizontal trench; | 33'-vertical through hole |

DETAILED DESCRIPTION

In order to make the objects, technical solutions and advantages of the embodiments of the present application more clear, the technical solutions in the embodiments of the present application are clearly described in the following in conjunction with the accompanying drawings in the embodiments of the present application. Obviously, the described embodiments are a part of the embodiments of the present application, and not all of the embodiments. All other embodiments obtained by a person of ordinary skill in the art based on the embodiments of the present application without any creative work belong to the protection scope of the present application.

A MEMS solenoid transformer described in the present application may include a toroidal soft magnetic core or a square loop soft magnetic core.

Figure 1:
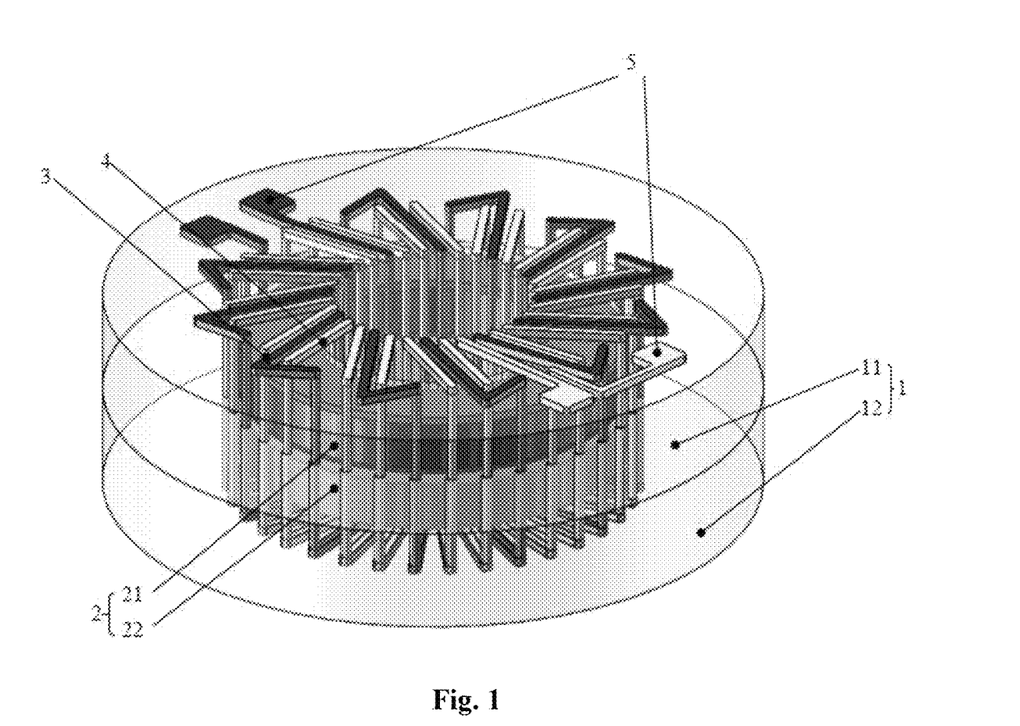
FIG. 1 is a schematic diagram showing a three-dimensional structure of a MEMS toroidal solenoid transformer according to an embodiment of the present application.
Figure 2:
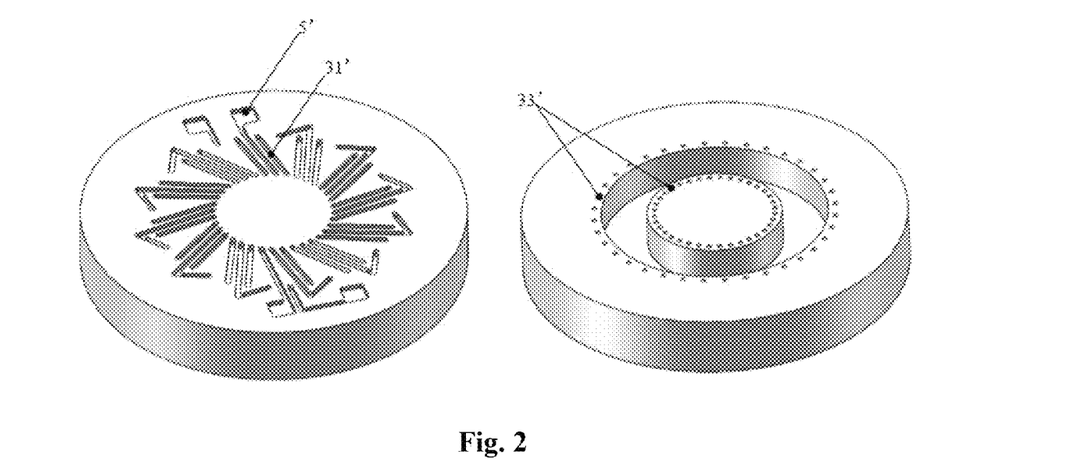
FIG. 2 is a first schematic diagram showing a three-dimensional structure of an upper silicon substrate according to an embodiment of the present application.
Figure 3:
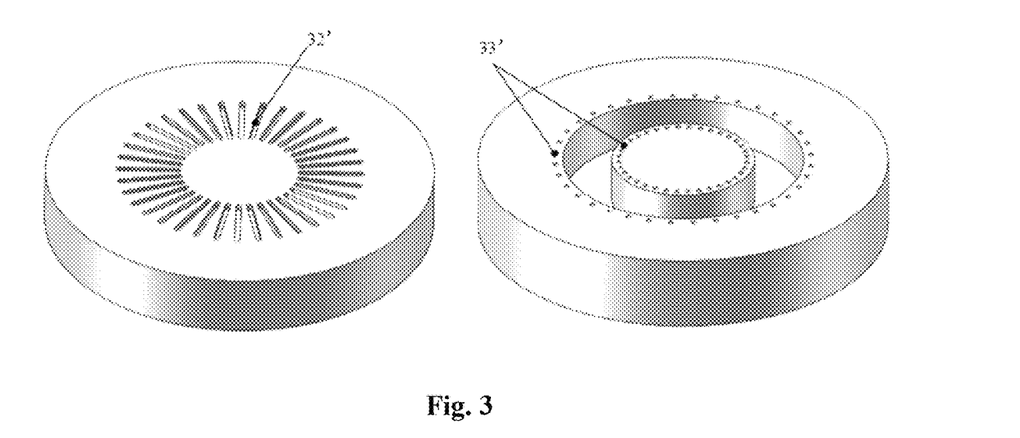
FIG. 3 is a first schematic diagram showing a three-dimensional structure of a lower silicon substrate according to an embodiment of the present application.

FIG. 1 is a schematic diagram showing a three-dimensional structure of a MEMS toroidal solenoid transformer according to an embodiment of the present application. As shown in FIG. 1, the MEMS toroidal solenoid transformer includes a silicon substrate 1, a toroidal soft magnetic core 2, a first solenoid 3 and a second solenoid 4: wherein, the toroidal soft magnetic core 2 is wrapped inside the silicon substrate 1, as shown in FIGS. 2 and 3, the silicon substrate 1 is provided with a first spiral channel and a second spiral channel, two opposite sides of the toroidal soft magnetic core 2 respectively pass through a center of the first spiral channel and a center of the second spiral channel, and the first solenoid 3 and the second solenoid 4 are respectively disposed in the first spiral channel and the second spiral channel.

In an embodiment, since the first spiral channel and the second spiral channel are both disposed on the silicon substrate 1, the first solenoid 3 and the second solenoid 4 respectively disposed in the first spiral channel and the second spiral channel are also disposed inside the silicon substrate 1, that is, the toroidal soft magnetic core 2, the first solenoid 3 and the second solenoid 4 of the transformer are all disposed inside the silicon substrate 1.

Specifically, the first solenoid 3 has the same shape as the first spiral channel, the second solenoid 4 has the same shape as the second spiral channel, and the first solenoid 3 and the second solenoid 4 are respectively disposed in the first spiral channel and the second spiral channel. Since the two opposite sides of the toroidal soft magnetic core 2 respectively pass through the center of the first spiral channel and the center of the second spiral channel, the two opposite sides of the toroidal soft magnetic core 2 also pass through the centers of the first solenoid 3 and the second solenoid 4, respectively. When the transformer is working, the first solenoid 3 is used as a primary winding of the transformer, and the second solenoid 4 is used as a secondary winding of the transformer. Head and tail ends of the first solenoid 3 constitute an input end of the transformer, and head and tail ends of the second solenoid 4 constitute an output end of the transformer. It may be understood that the transformation ratio of the transformer is determined by the numbers of turns of the first solenoid 3 and the second solenoid 4.

For the MEMS toroidal solenoid transformer according to the embodiments of the present application, by disposing the toroidal soft magnetic core, the first solenoid and the second solenoid of the transformer inside the silicon substrate completely, the thickness of the silicon substrate is fully utilized, and the obtained transformer has a larger winding cross-sectional area and a higher magnetic flux, which makes the inductance value of the transformer higher; at the same time, the silicon substrate plays a protective role on the toroidal soft magnetic core, the first solenoid and the second solenoid, the strength of the transformer is improved, and the good impact resistance is provided.

In the foregoing embodiments, as shown in FIGS. 1-3, the silicon substrate 1 is divided into an upper silicon substrate 11 and a lower silicon substrate 12, the toroidal soft magnetic core 2 is divided into an upper core 21 and a lower core 22, and the upper core 21 has the same shape as the lower core 22; and the upper silicon substrate 11 is provided with a core slot on a lower surface thereof corresponding to the shape of the upper core 21, and the lower silicon substrate 12 is provided with a core slot on an upper surface thereof corresponding to the shape of the lower core 22: the upper core 21 and the lower core 22 are disposed in the corresponding core slots, respectively, and the lower surface of the upper silicon substrate 11 and the upper surface of the lower silicon substrate 12 are bonded to each other, so that a lower surface of the upper core 21 and an upper surface of the lower core 22 are aligned with each other.

In an embodiment, the upper core 21 and the lower core 22 are two cores with the same shape, which are formed by dividing the toroidal soft magnetic core 2 in the vertical direction equally. Each of the upper core 21 and the lower core 22 has a toroidal shape and a thickness of being half of the thickness of the toroidal soft magnetic core 2. In the same way, the upper silicon substrate 11 and the lower silicon substrate 12 are formed by dividing the silicon substrate 1 in a vertical direction equally, and both are arranged symmetrically.

By dividing the silicon substrate and the toroidal soft magnetic core into two equal parts, respectively, the overall transformer is convenient to process. At the same time, by dividing the toroidal soft magnetic core into two parts: the upper core and the lower core, the eddy current loss in the iron core may be reduced, which further improves the efficiency of the transformer.

In the foregoing embodiments, as shown in FIGS. 2 and 3, the first spiral channel and the second spiral channel include a plurality of first horizontal trenches 31', a plurality of second horizontal trenches 32', and a plurality of vertical through holes 33', respectively:

the first horizontal trenches 31' are disposed on the upper surface of the silicon substrate 1, the second horizontal trenched 32' are disposed on the lower surface of the silicon substrate 1, and the vertical through holes 33' penetrate the upper and lower surfaces of the silicon substrate; and the head and tail of any one of the first horizontal trenches 31' of the first spiral channel and the second spiral channel communicate with two vertical through holes 33' respectively, and the two vertical through holes 33' communicate with two adjacent second horizontal trenches 32', respectively.

In an embodiment, when the silicon substrate 1 is divided into the upper silicon substrate 11 and the lower silicon substrate 12, each vertical through hole 33' is also divided into two parts located in the upper silicon substrate 11 and the lower silicon substrate 12, respectively.

Specifically, in one spiral channel, the plurality of first horizontal trenches 31' and the plurality of second horizontal trenches 32' communicate by the plurality of vertical through holes 33'. It may be understood that the vertical through holes 33' may be linear or arc-shaped, and the first horizontal trenches 31' and the second horizontal trenches 32' may also be linear or arc-shaped.

In the foregoing embodiments, as shown in FIG. 1, the transformer further includes four pins 5 and four pin slots 5':

the four pin slots 5' are disposed on the upper surface of the silicon substrate 1, two of the four pin slots 5' communicate with the head and the tail of the first spiral channel, respectively, and the other two of the four pin slots 5' communicates with the head and the tail of the second spiral channel, respectively, and the four pins 5 are arranged in the four pin slots 5', respectively.

Specifically, since two of the four pin slots 5' communicate with the head and the tail of the first spiral channel and the other two of the four pin slots 5' communicate with the head and the tail of the second spiral channel, two of the four pins 5 are connected to the head and the tail of the first solenoid 3 and the other two of the four pins 5 communicate with the head and tail of the second solenoid 4. When the transformer is working, two of the four pins 5 constitute the input end of the transformer, and the other two of the four pins 5 constitute the output end of the transformer.

In the foregoing embodiments, the toroidal soft magnetic core 2 is made of iron-nickel alloy material or iron-cobalt alloy material.

In the foregoing embodiments, the first solenoid 3 and the second solenoid 4 are made of metallic copper.

Figure 4:
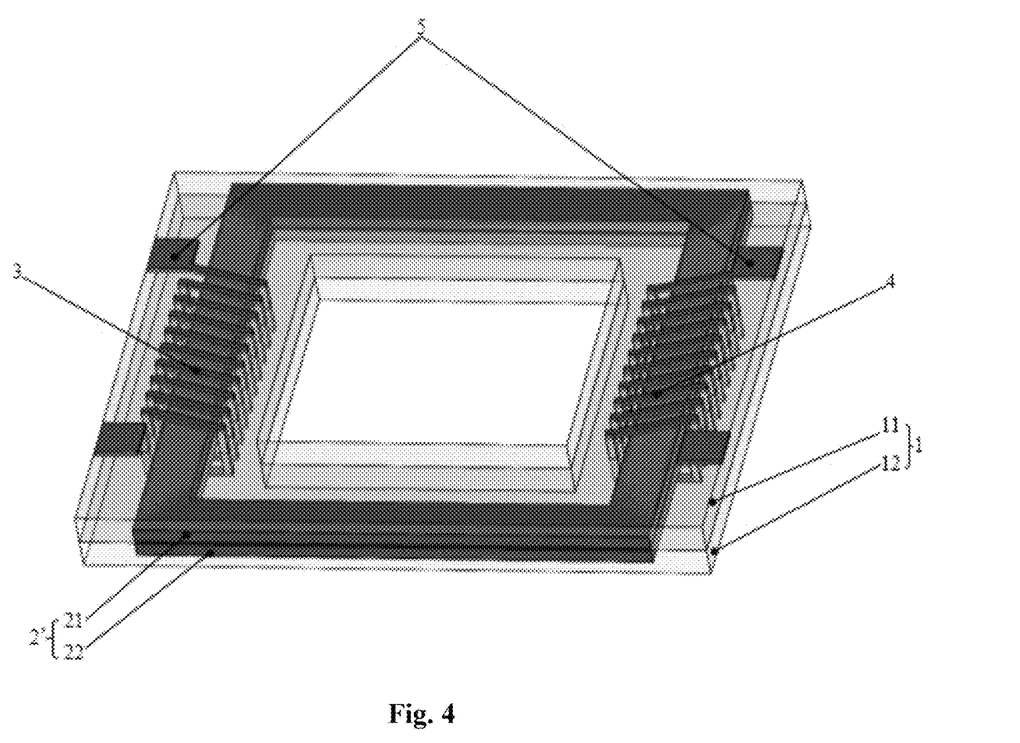
FIG. 4 is a schematic diagram showing a three-dimensional structure of a MEMS square loop solenoid transformer according to an embodiment of the present application.
Figure 5:
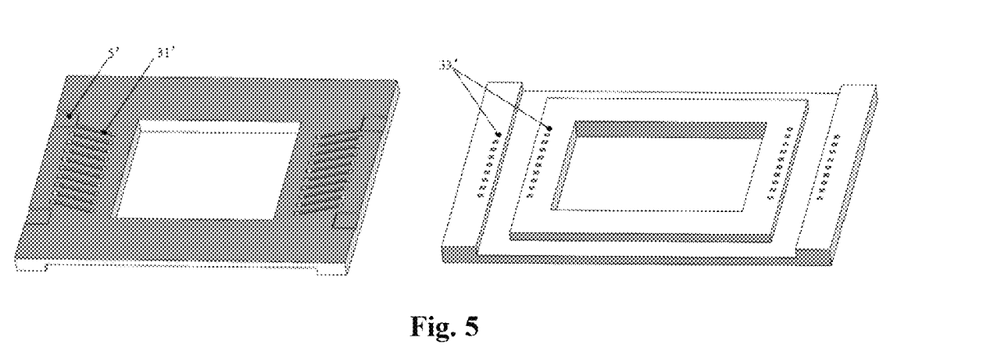
FIG. 5 is a second schematic diagram showing a three-dimensional structure of an upper silicon substrate according to an embodiment of the present application.
Figure 6:
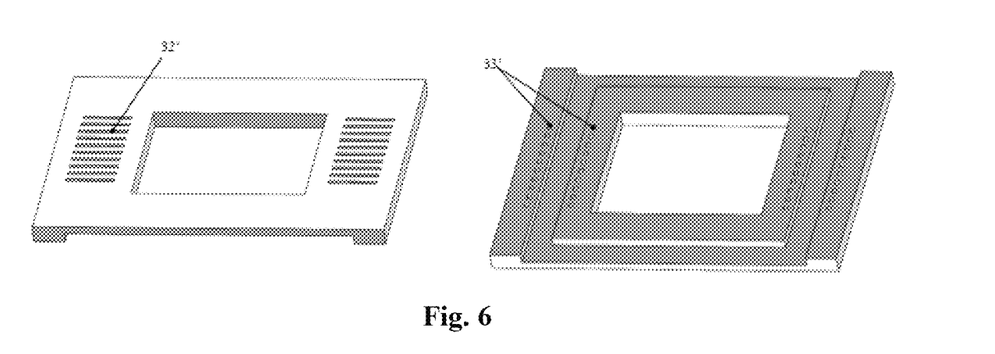
FIG. 6 is a second schematic diagram showing a three-dimensional structure of a lower silicon substrate according to an embodiment of the present application.

FIG. 4 is a schematic diagram showing a three-dimensional structure of a MEMS square loop solenoid transformer according to an embodiment of the present application. As shown in FIG. 4, the MEMS square loop solenoid transformer includes a silicon substrate 1, a square loop soft magnetic core 2', a first solenoid 3 and a second solenoid 4: wherein, the square loop soft magnetic core 2' is wrapped inside the silicon substrate 1, as shown in FIGS. 5 and 6, the silicon substrate 1 is provided with a first spiral channel and a second spiral channel, two opposite sides of the square soft magnetic core 2' respectively pass through a center of the first spiral channel and a center of the second spiral channel, and the first solenoid 3 and the second solenoid 4 are respectively disposed in the first spiral channel and the second spiral channel.

In an embodiment, since the first spiral channel and the second spiral channel are both disposed on the silicon substrate 1, the first solenoid 3 and the second solenoid 4 respectively disposed in the first spiral channel and the second spiral channel are also disposed inside the silicon substrate 1, that is, the square soft magnetic core 2', the first solenoid 3 and the second solenoid 4 of the transformer are all disposed inside the silicon substrate 1.

Specifically, the first solenoid 3 has the same shape as the first spiral channel, the second solenoid 4 has the same shape as the second spiral channel, and the first solenoid 3 and the second solenoid 4 are respectively disposed in the first spiral channel and the second spiral channel. Since the two opposite sides of the square loop soft magnetic core 2' respectively pass through the center of the first spiral channel and the center of the second spiral channel, the two opposite sides of the square loop soft magnetic core 2' also pass through the centers of the first solenoid 3 and the second solenoid 4, respectively. When the transformer is working, the first solenoid 3 is used as a primary winding of the transformer, and the second solenoid 4 is used as a secondary winding of the transformer. Head and tail ends of the first solenoid 3 constitute an input end of the transformer, and head and tail ends of the second solenoid 4 constitute an output end of the transformer. It may be understood that the transformation ratio of the transformer is determined by the numbers of turns of the first solenoid 3 and the second solenoid 4.

The silicon substrate 1 is divided into an upper silicon substrate 11 and a lower silicon substrate 12, the square loop soft magnetic core 2' is divided into an upper core 21 and a lower core 22, and the upper core 21 has the same shape as the lower core 22; and the upper silicon substrate 11 is provided with a core slot on a lower surface thereof corresponding to the shape of the upper core 21, and the lower silicon substrate 12 is provided with a core slot on an upper surface thereof corresponding to the shape of the lower core 22: the upper core 21 and the lower core 22 are disposed in the corresponding core slots, respectively, and the lower surface of the upper silicon substrate 11 and the upper surface of the lower silicon substrate 12 are bonded to each other, so that the lower surface of the upper core 21 and the upper surface of the lower core 22 are aligned with each other.

In an embodiment, the upper core 21 and the lower core 22 are two cores with the same shape, which are formed by dividing the square loop soft magnetic core 2' in the vertical direction equally. Each of the upper core 21 and the lower core 22 has a square shape and a thickness of half of the thickness of the square soft magnetic core 2'. In the same way, the upper silicon substrate 11 and the lower silicon substrate 12 are formed by dividing the silicon substrate 1 in a vertical direction equally, and both are arranged symmetrically.

By dividing the silicon substrate and the square soft magnetic core into two equal parts respectively, the overall transformer is convenient to process. At the same time, by dividing the square loop soft magnetic core into two parts: the upper core and the lower core, the eddy current loss in the iron core may be reduced, which further improves the efficiency of the transformer.

In the foregoing embodiment, as shown in FIGS. 5 and 6, the first spiral channel and the second spiral channel include a plurality of first horizontal trenches 31', a plurality of second horizontal trenches 32', and a plurality of vertical through holes 33', respectively:

the first horizontal trenches 31' are disposed on the upper surface of the silicon substrate 1, the second horizontal trenches 32' are disposed on the lower surface of the silicon substrate 1, and the vertical through holes 33' penetrate through the upper and lower surfaces of the silicon substrate; and the head and the tail of any one of the first horizontal trenches 31' of the first spiral channel and the second spiral channel communicate with two vertical through holes 33' respectively, and the two vertical through holes 33' communicate with two adjacent second horizontal trenches 32', respectively.

In an embodiment, when the silicon substrate 1 is divided into the upper silicon substrate 11 and the lower silicon substrate 12, each vertical through hole 33' is also divided into two parts located in the upper silicon substrate 11 and the lower silicon substrate 12 respectively.

Specifically, in one spiral channel, the plurality of first horizontal trenches 31' disposed parallel to each other and the plurality of second horizontal trenches 32' also disposed parallel to each other communicate by the plurality of vertical through holes 33'. It may be understood that the vertical through holes 33' may be linear or arc-shaped, and the first horizontal trenches 31' and the second horizontal trenches 32' may also be linear or arc-shaped.

In the foregoing embodiments, as shown in FIG. 1, the transformer further includes four pins 5 and four pin slots 5';

the four pin slots 5' are disposed on the upper surface of the silicon substrate 1, two of the four pin slots 5' communicate with the head and the tail of the first spiral channel, respectively, and the other two of the four pin slots 5' communicate with the head and the tail of the second spiral channel, respectively, and the four pins 5 are arranged in the four pin slots 5', respectively.

Specifically, since two of the four pin slots 5' communicate with the head and the tail of the first spiral channel, the other two of the four pin slots 5' communicate with the head and the tail of the second spiral channel, two of the four pins 5 are connected to the head and the tail of the first solenoid 3, and the other two of the four pins 5 communicate with the head and the tail of the second solenoid 4. When the transformer is working, two of the four pins 5 constitute the input end of the transformer, and the other two of the four pins 5 constitute the output end of the transformer.

In the foregoing embodiments, the square loop soft magnetic core 2' is made of iron-nickel alloy material or iron-cobalt alloy material.

In the foregoing embodiments, the first solenoid 3 and the second solenoid 4 are made of metallic copper.

An embodiment of the present application provides a method for manufacturing a MEMS solenoid transformer, including:

step 1, fabricating an upper silicon substrate and a lower silicon substrate, respectively: wherein the fabricating an upper silicon substrate includes: performing a first thermal oxidation on a first silicon wafer with a first preset thickness: according to the structures and relative positions of the first spiral channel and the second spiral channel, performing deep silicon etching on an upper surface, inside and a lower surface of the first silicon wafer subjected to the first thermal oxidation respectively to obtain a plurality of first horizontal trenches, upper halves of a plurality of vertical through holes, and a core slot: performing a second thermal oxidation on the first silicon wafer subjected to the deep silicon etching to obtain the upper silicon substrate: the fabricating a lower silicon substrate includes: performing the first thermal oxidation on a second silicon wafer with the first preset thickness: according to the structures and relative positions of the first spiral channel and the second spiral channel, performing the deep silicon etching on an upper surface, inside and a lower surface of the second silicon wafer subjected to the first thermal oxidation respectively to obtain a core slot, lower halves of the plurality of vertical through holes, and a plurality of second horizontal trenches: performing the second thermal oxidation on the second silicon wafer subjected to the deep silicon etching to obtain the lower silicon substrate;

step 2, electroplating inside the core slots of the upper silicon substrate and the lower silicon substrate to form an upper core and a lower core, respectively;

step 3, after disposing the upper surface of the upper silicon substrate and the lower surface of the lower silicon substrate opposite to each other and aligning the lower surface of the upper core and the upper surface of the lower core with each other, bonding the upper silicon substrate and the lower silicon substrate at low temperature to form the first spiral channel and the second spiral channel in the upper silicon substrate and the lower silicon substrate which are bonded; and step 4, electroplating in the first spiral channel and the second spiral channel to form a first solenoid and a second solenoid, thereby obtaining the MEMS solenoid transformer.

In an embodiment, in step 1, the difference in structure between the upper silicon substrate 11 and the lower silicon substrate 12 is essentially only that the upper surface of the upper silicon substrate 11 is provided with the first horizontal trenches 31' while the lower surface of the lower silicon substrate 12 is provided with the second horizontal trenches 32', the remaining structures thereof are the same, and the upper silicon substrate 11 and the lower silicon substrate 12 are arranged symmetrically and processed in a basically identical manner before being bonded.

In step 2, the upper core 21 and the lower core 22 are formed by electroplating on the upper silicon substrate 11 and the lower silicon substrate 12, respectively. Because the core needs to be completely wrapped inside the silicon substrate, the step of core electroplating is completed before the upper silicon substrate 11 and the lower silicon substrate 12 are bonded.

In step 3, when the upper silicon substrate 11 and the lower silicon substrate 12 are bonded, it is necessary to ensure that the lower surface of the upper core 21 and the upper surface of the lower core 22 are aligned with each other to ensure the magnetic fields of the upper core 21 and the lower core 22 coordinate with each other. At the same time, after the upper silicon substrate 11 and the lower silicon substrate 12 are bonded, the horizontal trenches previously disposed on the upper silicon substrate 11 and the lower silicon substrate 12 respectively and the vertical through holes are combined to form the first spiral channel and the second spiral channel.

In step 4, after the first spiral channel and the second spiral channel are formed, the first solenoid 3 and the second solenoid 4 may be formed only by electroplating relevant metal therein.

Specifically, the first silicon wafer and the second silicon wafer may be double-polished silicon wafers having a thickness of 1000 μm, and also high-resistivity silicon wafers so as to improve the overall insulation of the transformer and reduce the eddy current loss under a high frequency. It is generally sufficient to form a thermal oxide layer having a thickness of 2 μm when the first silicon wafer and the second silicon wafer are subjected to thermal oxidation. According to the structures and relative positions of the soft magnetic core 2, the first spiral channel 3 and the second spiral channel 4, deep silicon etching is performed on the first silicon wafer and the second silicon wafer to obtain the upper silicon substrate 11 and the lower silicon substrate 12, and thermal oxidation treatment is performed, then the upper silicon substrate 11 and the lower silicon substrate 12 may be used as bases for fabricating other structures of the transformer. Next, the upper core 21 and the lower core 22 are formed at the corresponding positions of the upper silicon substrate 11 and the lower silicon substrate 12 by electroplating. The upper core 21 and the lower core 22 are wrapped inside the silicon substrate 1 by bonding, and a complete first spiral channel and second spiral channel are formed. Electroplating is performed in the first spiral channel and the second spiral channel to form a first solenoid 3 and a second solenoid 4, thereby completing the fabrication of the MEMS solenoid transformer.

In the method for manufacturing a MEMS solenoid transformer according to the embodiment of the present application, the silicon substrate is divided into two symmetrical parts to be fabricated separately, and then the core electroplating is completed before bonding the upper and lower silicon substrates, and electroplating is performed after bonding the upper and lower silicon substrates to form solenoids. It is ensured that the transformer may be inserted into the core with high efficiency and high quality. In other ways, it is difficult to form a core slot in the middle of the coil and insert the core, and it is hardly to achieve the above purpose. Therefore, no multilayer deep silicon etching needs to be adopted during the entire manufacturing process, which improves the fault tolerance rate of processing and has good repeatability. The obtained transformer has high structural accuracy, is compatible with IC semiconductor processes, and is suitable for large-scale production. Through the technical solution, the thickness of the silicon substrate is fully utilized, the transformer obtained has a larger winding cross-sectional area and a higher magnetic flux, which makes the inductance value of the transformer higher; at the same time, the silicon substrate plays a protective role on the soft magnetic core and the solenoids, the strength of the transformer is improved, and the good impact resistance is provided.

In the foregoing embodiments, the electroplating inside the core slot of the upper silicon substrate 11 to form an upper core 21 specifically includes:
  after registering a metal mask with a core slot pattern with the core slot on the lower surface of the upper silicon substrate 11, tightly attaching the metal mask to the lower surface of the upper silicon substrate 11; and
  after magnetron sputtering metallic nickel or metallic cobalt with a second preset thickness as a seed layer on the lower surface of the upper silicon substrate 11, electroplating iron-nickel alloy or iron-cobalt alloy with a third preset thickness inside the core slot of the upper silicon substrate 11 to obtain the upper core 21.

Correspondingly, the electroplating inside the core slot of the lower silicon substrate 12 to form a lower core 22 specifically includes:
  after registering a metal mask with a core slot pattern with the core slot on the upper surface of the lower silicon substrate 12, tightly attaching the metal mask to the upper surface of the lower silicon substrate 12; and
  after magnetron sputtering metallic nickel or metallic cobalt with the second preset thickness as a seed layer on the upper surface of the lower silicon substrate 12, electroplating iron-nickel alloy or iron-cobalt alloy with the third preset thickness inside the core slot of the lower silicon substrate 12 to obtain the lower core 22.

In an embodiment, when the core is made of iron-nickel alloy, the corresponding seed layer is made of metallic nickel: while when the core is made of iron-cobalt alloy, the corresponding seed layer is made of metallic cobalt. The thickness of the seed layer, i.e., the second preset thickness may be determined according to actual process requirements. The thickness of the upper core 21 and the lower core 22, i.e., the third preset thickness is determined according to the depths of the core slots.

Specifically, the processes adopted in the manufacturing procedures of the upper core 21 and the lower core 22 are completely the same, except that the positions where the upper core 21 and the lower core 22 are formed are different, and both may be processed separately at the same time.

In the foregoing embodiments, the electroplating in the first spiral channel and the second spiral channel to form a first solenoid 3 and a second solenoid 4 specifically includes:
  magnetron sputtering metallic titanium with a fourth preset thickness as an intermediate layer on the lower surface of the lower silicon substrate, magnetron sputtering metallic copper with a fifth preset thickness as a seed layer on the intermediate layer, and then electroplating metallic copper in the second horizontal trenches and the vertical through holes of the first spiral channel and the second spiral channel until the metallic copper is filled to the position of a lower plane of the first horizontal trenches; and
  after magnetron sputtering metallic copper as a seed layer on the upper surface of the upper silicon substrate, electroplating metallic copper until the first spiral channel and the second spiral channel are completely filled with the metallic copper to obtain the first solenoid and the second solenoid.

In the foregoing embodiments, the fabricating an upper silicon substrate further includes:
  according to the structures and positions of four pins, performing deep silicon etching on the upper surface of the first silicon wafer subjected to the first oxidation to obtain four pin slots;
  correspondingly, step 4 further includes:
  electroplating in the four pin slots to form the four pins.

The manufacturing method of the MEMS solenoid transformer is further described by an example. It should be noted that the following is only an example of the embodiment of the present application, and the embodiment of the present application is not limited thereto.

Figure 7:
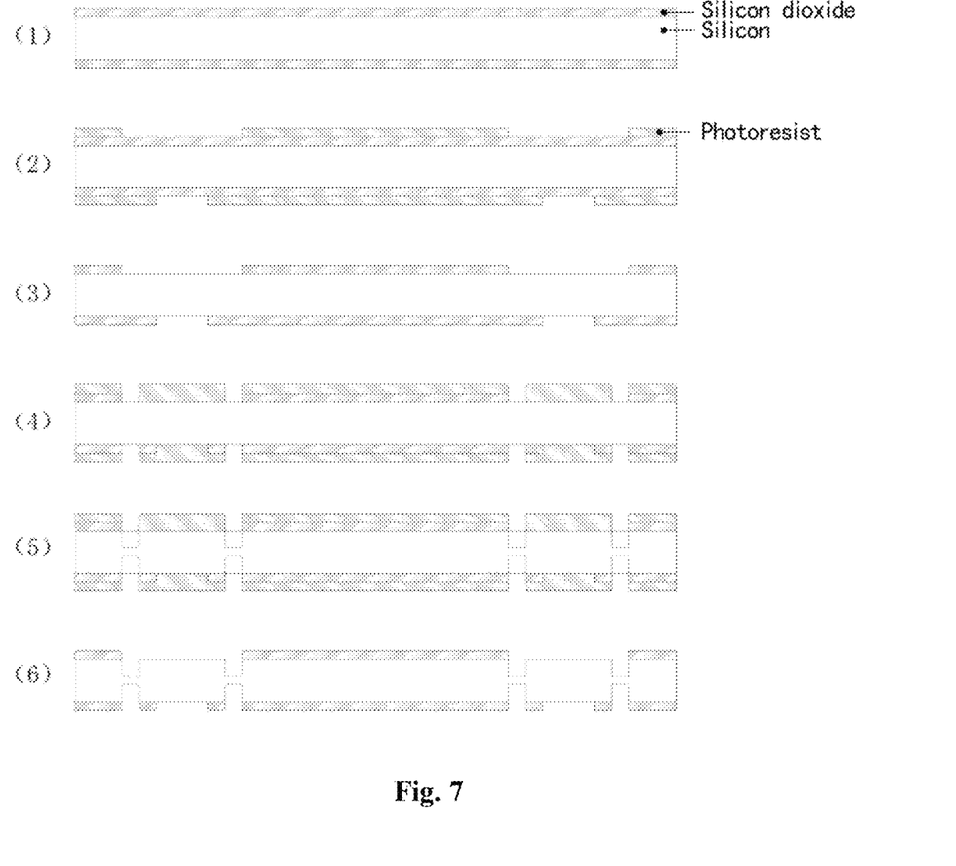
FIG. 7 is a schematic cross-sectional view of steps (1) to (6) of a manufacturing process of a MEMS solenoid transformer in an example according to an embodiment of the present application.
Figure 8:
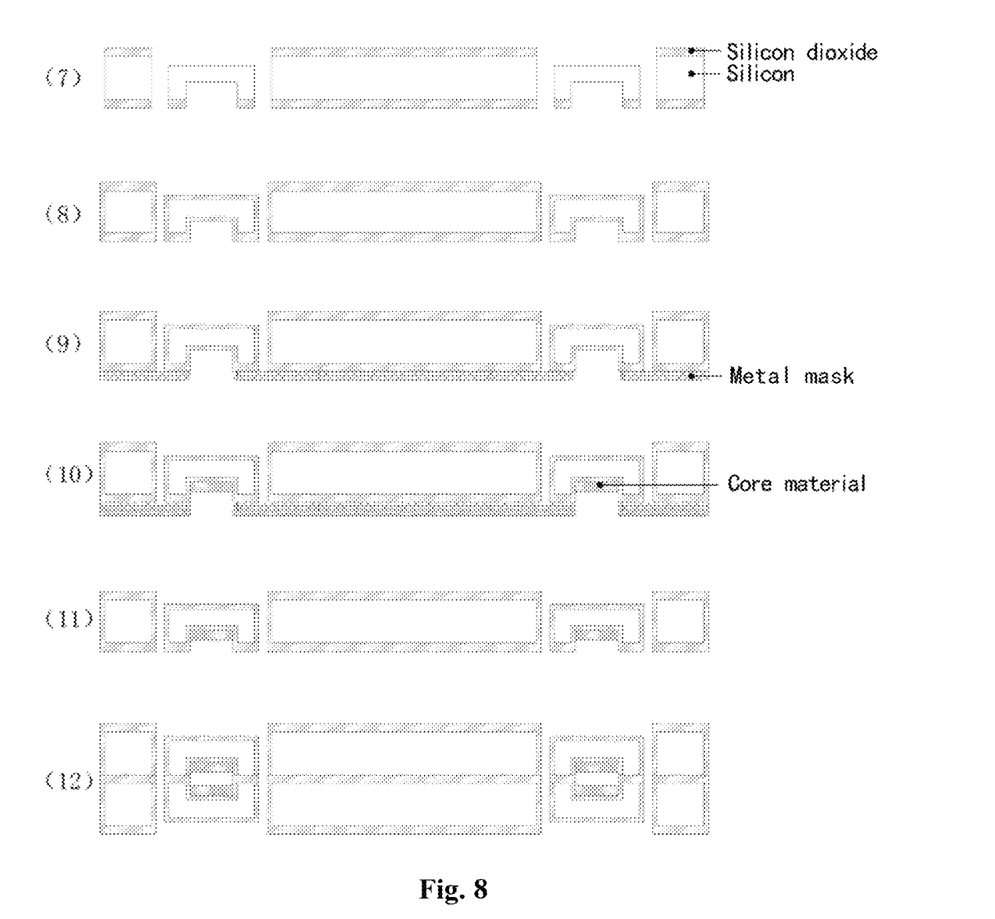
FIG. 8 is a schematic cross-sectional view of steps (7) to (12) of a manufacturing process of a MEMS solenoid transformer in an example according to an embodiment of the present application.
Figure 9:
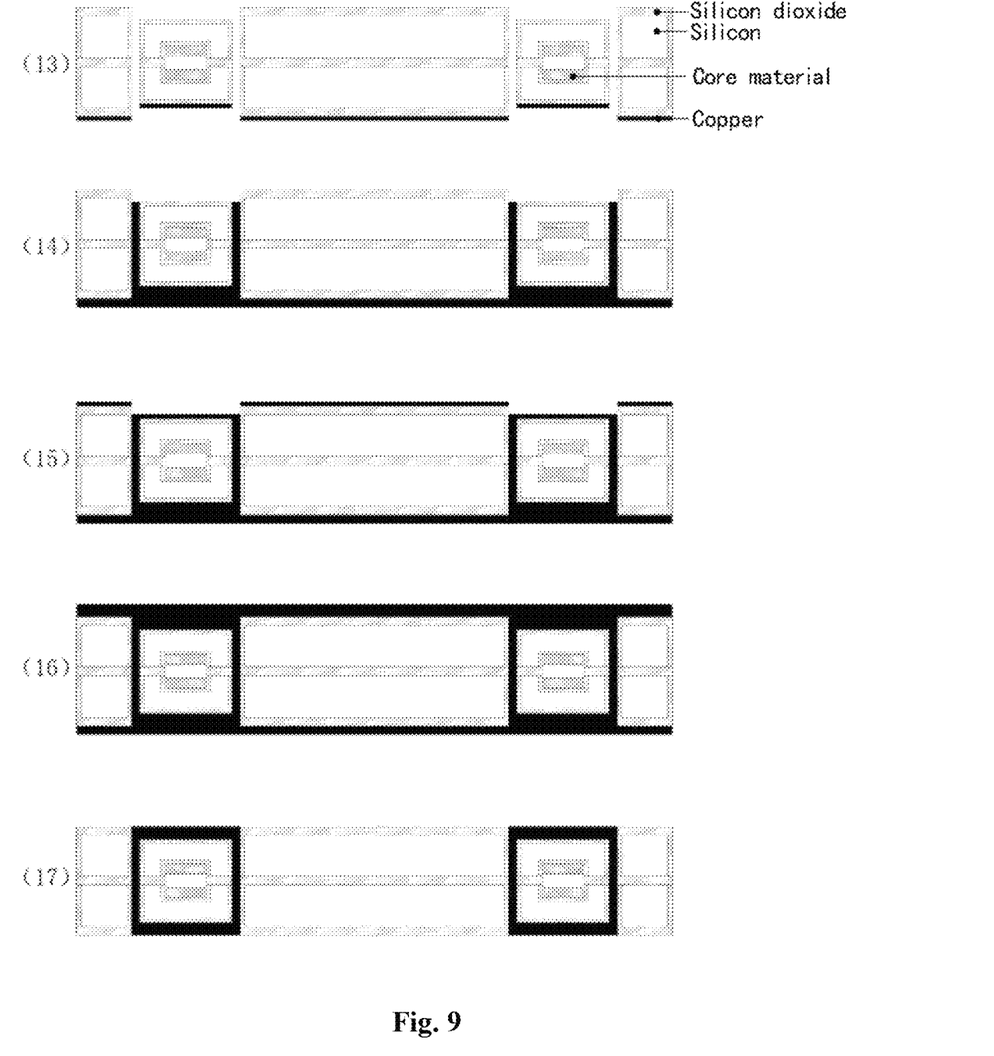
FIG. 9 is a schematic cross-sectional view of steps (13) to (17) of a manufacturing process of a MEMS solenoid transformer in an example according to an embodiment of the present application.

FIGS. 7 to 9 show schematic cross-sectional views of steps (1) to (17) of a manufacturing process of a MEMS solenoid transformer in an example according to an embodiment of the present application, which may be used for manufacturing a MEMS toroidal solenoid transformer or a MEMS square loop solenoid transformer: specifically:
(1) adopting double-polished silicon wafers having a thickness of 1000 μm, wherein high-resistivity silicon wafers are adopted to improve the overall structural insulation and reduce the eddy current loss under a high frequency, and the silicon wafer is subjected to thermal oxidization to produce a double-sided thermal oxide layer having a thickness of 2 μm;
(2) coating a photoresist, exposing the first horizontal trenches (covering positions of the vertical through holes) and contact patterns on the upper surface of the upper silicon substrate, exposing the vertical through holes and the second horizontal trenches on the upper surface of the lower silicon substrate, exposing core slot patterns on the lower surfaces of the upper silicon substrate and the lower silicon substrate, respectively, and constituting spiral channels from the first horizontal trenches, the second horizontal trenches and the vertical through holes;
(3) removing silicon dioxide at the exposed positions by a BOE (buffered oxide etch) solution to pattern the silicon dioxide;
(4) coating a photoresist for a second time and exposing vertical through hole patterns on the upper and lower surfaces of the upper silicon substrate and the lower silicon substrate;
(5) performing deep silicon etching on the upper and lower surfaces to etch the silicon through hole patterns to a certain depth;
(6) removing the photoresist using piranha solution;
(7) etching the upper surface with the oxide layer as a masking layer to obtain horizontal trenches on the upper surface and vertical through holes, and etching the lower surface with the oxide layer as a masking layer to obtain core pattern;
(8) performing thermal oxidation to form an oxide layer having a thickness of 2 μm;
(9) taking the metal mask with the core slot patterns, aligning the core slot patterns thereon with the core slot patterns on the lower surfaces of the first silicon wafer and the second silicon wafer, and tightly attaching the metal mask to the lower surface of the silicon wafers;
(10) magnetron sputtering 100 nm of metallic nickel as a seed layer on the lower surface;
(11) electroplating iron-nickel alloy and filling the iron-nickel alloy from the bottom to 100 μm from the surface of the silicon wafer;
(12) opposing the lower surfaces of the upper silicon substrate and the lower silicon substrate to each other, and performing low-temperature silicon-silicon bonding;
(13) magnetron sputtering 100 nm of metallic nickel as an intermediate layer on the lower surface, and then sputtering 500 nm of metallic copper as a seed layer;
(14) electroplating metallic copper, filling the electroplated copper from the bottom to the position of the lower plane of the horizontal wire at the top;
(15) magnetron sputtering 500 nm of metallic copper on the upper surface;
(16) electroplating metallic copper, so that the entire structure on the upper surface is completely covered by the electroplated copper; and
(17) thinning metallic copper on the upper and lower surfaces by a CMP (chemical mechanical polisher) until the metallic copper is thinned to the same height as to the surface of the thermal oxide layer of the silicon wafer, and then polishing the surfaces by CMP to complete the fabrication of the MEMS micro-transformer.

Finally, it should be noted that the above embodiments are only used to explain the technical solutions of the present application, and are not limited thereto; although the present application is described in detail with reference to the foregoing embodiments, it should be understood by those skilled in the art that they can still modify the technical solutions described in the foregoing embodiments or make equivalent replacements to a part of the technical features; and these modifications or substitutions do not cause the essence of the corresponding technical solutions depart from the spirit and scope of the technical solutions of various embodiments of the present application.

The invention claimed is:
1. A MEMS square loop solenoid transformer, comprising:
a silicon substrate, a soft magnetic core, a first solenoid and a second solenoid;
wherein, the soft magnetic core is wrapped inside the silicon substrate, the silicon substrate is provided with a first spiral channel and a second spiral channel, and two opposite sides of the soft magnetic core respectively pass through a center of the first spiral channel and a center of the second spiral channel, wherein the first solenoid and the second solenoid are respectively disposed in the first spiral channel and the second spiral channel;
wherein the silicon substrate comprises an upper silicon substrate and a lower silicon substrate, the soft magnetic core comprises an upper core and a lower core, and the upper core has a same shape as the lower core;
wherein the upper silicon substrate is provided with a core slot on a lower surface thereof corresponding to a shape of the upper core, and the lower silicon substrate is provided with a core slot on an upper surface thereof corresponding to a shape of the lower core; and
wherein the upper core and the lower core are disposed in the corresponding core slots, respectively, and the lower surface of the upper silicon substrate and the upper surface of the lower silicon substrate are bonded to each other, so that a lower surface of the upper core and an upper surface of the lower core are aligned with each other.
2. The MEMS square loop solenoid transformer of claim 1, wherein the first spiral channel and the second spiral channel comprise a plurality of first horizontal trenches, a plurality of second horizontal trenches and a plurality of vertical through holes, respectively;
the first horizontal trenches are disposed on an upper surface of the silicon substrate, the second horizontal trenches are disposed on a lower surface of the silicon substrate, and the vertical through holes penetrate the upper and lower surfaces of the silicon substrate; and
a head and a tail of any one of the first horizontal trenches of the first spiral channel and the second spiral channel communicate with two vertical through holes respectively, and the two vertical through holes communicate with two adjacent second horizontal trenches, respectively.
3. The MEMS square loop solenoid transformer of claim 1, further comprising further comprising four pins and four pin slots; and
wherein the four pin slots are disposed on an upper surface of the silicon substrate, two of the four pin slots communicate with a head and a tail of the first spiral channel, respectively, and the other two of the four pin slots communicate with a head and a tail of the second spiral channel, respectively, and the four pins are arranged in the four pin slots, respectively.

4. The MEMS square loop solenoid transformer of claim 1, wherein the soft magnetic core is made of an iron-nickel alloy material or an iron-cobalt alloy material.

5. The MEMS square loop solenoid transformer of claim 1, wherein the first solenoid and the second solenoid are made of metallic copper.

6. A method for manufacturing the MEMS square loop solenoid transformer of claim 1, the method comprising the steps of:
- step 1, fabricating the upper silicon substrate and the lower silicon substrate, respectively;
    - wherein the fabricating the upper silicon substrate includes:
        - performing a first thermal oxidation on a first silicon wafer with a first preset thickness;
        - according to structures and relative positions of the first spiral channel and the second spiral channel, performing deep silicon etching on an upper surface, inside and a lower surface of the first silicon wafer subjected to the first thermal oxidation respectively to obtain a plurality of first horizontal trenches, upper halves of a plurality of vertical through holes, and a core slot;
        - performing a second thermal oxidation on the first silicon wafer subjected to the deep silicon etching to obtain the upper silicon substrate;
    - wherein the fabricating the lower silicon substrate includes:
        - performing the first thermal oxidation on a second silicon wafer with the first preset thickness;
        - according to structures and relative positions of the first spiral channel and the second spiral channel, performing the deep silicon etching on an upper surface, inside and a lower surface of the second silicon wafer subjected to the first thermal oxidation respectively to obtain a core slot, lower halves of the plurality of vertical through holes, and a plurality of second horizontal trenches;
        - performing the second thermal oxidation on the second silicon wafer subjected to the deep silicon etching to obtain the lower silicon substrate;
- step 2, electroplating inside the core slots of the upper silicon substrate and the lower silicon substrate to form the upper core and the lower core, respectively;
- step 3, after disposing the upper surface of the upper silicon substrate and the lower surface of the lower silicon substrate opposite to each other and aligning the lower surface of the upper core and the upper surface of the lower core with each other, bonding the upper silicon substrate and the lower silicon substrate at low temperature to form the first spiral channel and the second spiral channel in the upper silicon substrate and the lower silicon substrate which are bonded; and
- step 4, electroplating in the first spiral channel and the second spiral channel to form the first solenoid and the second solenoid, thereby obtaining the MEMS solenoid transformer.

7. The method of claim 6, wherein the electroplating inside the core slot of the upper silicon substrate to form the upper core comprises:
- after registering a metal mask with a core slot pattern with the core slot on the lower surface of the upper silicon substrate, tightly attaching the metal mask to the lower surface of the upper silicon substrate; and
- after magnetron sputtering metallic nickel or metallic cobalt with a second preset thickness as a seed layer on the lower surface of the upper silicon substrate, electroplating iron-nickel alloy or iron-cobalt alloy with a third preset thickness inside the core slot of the upper silicon substrate to obtain the upper core; correspondingly, the electroplating inside the core slot of the lower silicon substrate to form the lower core comprises:
- after registering a metal mask with a core slot pattern with the core slot on the upper surface of the lower silicon substrate, tightly attaching the metal mask to the upper surface of the lower silicon substrate; and
- after magnetron sputtering metallic nickel or metallic cobalt with the second preset thickness as a seed layer on the upper surface of the lower silicon substrate, electroplating iron-nickel alloy or iron-cobalt alloy with the third preset thickness inside the core slot of the lower silicon substrate to obtain the lower core.

8. The method of claim 6, wherein the electroplating in the first spiral channel and the second spiral channel to form the first solenoid and the second solenoid comprises:
- magnetron sputtering metallic titanium with a fourth preset thickness as an intermediate layer on the lower surface of the lower silicon substrate, magnetron sputtering metallic copper with a fifth preset thickness as a seed layer on the intermediate layer, and then electroplating metallic copper in the second horizontal trenches and the vertical through holes of the first spiral channel and the second spiral channel until the metallic copper is filled to a position of a lower plane of the first horizontal trenches; and
- after magnetron sputtering metallic copper as a seed layer on the upper surface of the upper silicon substrate, electroplating metallic copper until the first spiral channel and the second spiral channel are completely filled with the metallic copper to obtain the first solenoid and the second solenoid.

9. The method of claim 6, wherein the fabricating the upper silicon substrate further comprises:
- according to the structures and positions of four pins, performing deep silicon etching on the upper surface of the first silicon wafer subjected to a first oxidation to obtain four pin slots; correspondingly,
- step 4 further includes electroplating in the four pin slots to form the four pins.

* * * * *